(12) United States Patent
Kimura et al.

(10) Patent No.: US 10,771,039 B2
(45) Date of Patent: Sep. 8, 2020

(54) ACOUSTIC WAVE DEVICE, HIGH FREQUENCY FRONT END CIRCUIT, COMMUNICATION APPARATUS, AND MANUFACTURING METHOD FOR ACOUSTIC WAVE DEVICE

(71) Applicant: Murata Manufacturing Co., Ltd., Nagaokakyo-shi, Kyoto-fu (JP)

(72) Inventors: Tetsuya Kimura, Nagaokakyo (JP); Ville Kaajakari, Smyrna, GA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/551,793

(22) Filed: Aug. 27, 2019

(65) Prior Publication Data

US 2019/0386638 A1    Dec. 19, 2019

Related U.S. Application Data

(60) Provisional application No. PCT/JP2018/006681, filed on Feb. 23, 2018.

(30) Foreign Application Priority Data

Mar. 6, 2017   (JP) .................................. 2017-041355

(51) Int. Cl.
*H03H 9/02*     (2006.01)
*H03F 3/21*     (2006.01)
(Continued)

(52) U.S. Cl.
CPC ........... *H03H 9/02228* (2013.01); *H03F 3/21* (2013.01); *H03H 3/02* (2013.01);
(Continued)

(58) Field of Classification Search
CPC ...... H03F 2200/451; H03F 3/21; H03F 3/245; H03H 2003/023; H03H 3/02; H03H 3/08;
(Continued)

(56) References Cited

U.S. PATENT DOCUMENTS 6,377,139 B1    4/2002  Horiuchi et al.
10,153,748 B2 * 12/2018  Tanaka .............. H03H 9/02559
(Continued)

FOREIGN PATENT DOCUMENTS

JP       2000-106519 A     4/2000
JP       2000-278091 A    10/2000
(Continued)

OTHER PUBLICATIONS

Official Communication issued in International Patent Application No. PCT/JP2018/006681, dated Apr. 10, 2018.
(Continued)

*Primary Examiner* — Devan A Sandiford
(74) *Attorney, Agent, or Firm* — Keating & Bennett, LLP

(57) ABSTRACT

An acoustic wave device includes first and second electrode fingers provided on a first principal surface of a piezoelectric body. In a case that a portion where the first electrode finger and the second electrode finger overlap with each other when they are viewed from a first direction connecting the first and second end surfaces is an intersecting portion, and a distance between the first end surface and the second end surface in the piezoelectric body is a width of the piezoelectric body, a different width portion having a width different from the width of the piezoelectric body at a central portion of the intersecting portion in a second direction is provided in a region where the first end surface and the second end surface oppose each other.

20 Claims, 20 Drawing Sheets

(51) Int. Cl.
*H03H 3/02* (2006.01)
*H03H 9/13* (2006.01)
*H03H 9/17* (2006.01)
*H04B 1/10* (2006.01)

(52) U.S. Cl.
CPC ........ H03H 9/02102 (2013.01); H03H 9/132 (2013.01); H03H 9/174 (2013.01); H04B 1/1018 (2013.01); *H03F 2200/451* (2013.01); *H03H 2003/023* (2013.01)

(58) Field of Classification Search
CPC ........... H03H 9/02102; H03H 9/02228; H03H 9/132; H03H 9/145; H03H 9/174; H03H 9/64; H03H 9/72; H04B 1/1018
See application file for complete search history.

(56) References Cited

U.S. PATENT DOCUMENTS

| 10,374,570 | B2* | 8/2019 | Iwasaki | H03H 9/725 |
| 2002/0057036 | A1* | 5/2002 | Taniguchi | H03H 9/6483 |
| | | | | 310/313 B |
| 2002/0079989 | A1* | 6/2002 | Kadota | H03H 9/25 |
| | | | | 333/195 |
| 2002/0130736 | A1* | 9/2002 | Mukai | H03H 9/6433 |
| | | | | 333/193 |
| 2003/0034859 | A1* | 2/2003 | Kadota | H03H 9/02669 |
| | | | | 333/193 |
| 2012/0091855 | A1* | 4/2012 | Hatcher, Jr. | H01L 41/0533 |
| | | | | 310/313 C |
| 2017/0187352 | A1 | 6/2017 | Omura | |
| 2018/0069166 | A1* | 3/2018 | Samarao | H03H 9/25 |
| 2018/0123565 | A1 | 5/2018 | Takamine | |
| 2019/0386638 | A1* | 12/2019 | Kimura | H03H 3/02 |

FOREIGN PATENT DOCUMENTS

WO 2016/052129 A1 4/2016
WO 2016/208677 A1 12/2016

OTHER PUBLICATIONS

Song et al., "Wideband RF Filters Using Medium-Scale Integration of Lithium Niobate Laterally Vibrating Resonators", IEEE Electron Device Letters, vol. 38, No. 3, Mar. 2017, pp. 387-390.

* cited by examiner

US 10,771,039 B2

ACOUSTIC WAVE DEVICE, HIGH FREQUENCY FRONT END CIRCUIT, COMMUNICATION APPARATUS, AND MANUFACTURING METHOD FOR ACOUSTIC WAVE DEVICE

CROSS REFERENCE TO RELATED APPLICATIONS

This application claims the benefit of priority to Japanese Patent Application No. 2017-041355 filed on Mar. 6, 2017 and is a Continuation Application of PCT Application No. PCT/JP2018/006681 filed on Feb. 23, 2018. The entire contents of each application are hereby incorporated herein by reference.

BACKGROUND OF THE INVENTION

1. Field of the Invention

The present invention relates to an end surface reflection acoustic wave device, a manufacturing method for the same, and a high frequency front end circuit and a communication apparatus including the acoustic wave device.

2. Description of the Related Art

End surface reflection acoustic wave devices are known. For example, in Wideband RF Filters Using Medium-scale Integration of Lithium Niobate Laterally Vibrating Resonators (IEEE Electron Device Letters 2017, Volume: 38, Issue: 3, March 2017, Yong-Ha Song, Songbin Gong), an end surface reflection acoustic wave device using plate waves is disclosed. In Wideband RF Filters Using Medium-scale Integration of Lithium Niobate Laterally Vibrating Resonators (IEEE Electron Device Letters 2017, Volume: 38, Issue: 3, March 2017, Yong-Ha Song, Songbin Gong), a first electrode finger and a second electrode finger are arranged parallel to each other on a piezoelectric body having a thin thickness. A first end surface is located at an outer side portion in a width direction relative to an outer side edge of the first electrode finger. A second end surface is located at an outer side portion in the width direction relative to an outer side edge of the second electrode finger.

In the end surface reflection type acoustic wave device as described in Wideband RF Filters Using Medium-scale Integration of Lithium Niobate Laterally Vibrating Resonators (IEEE Electron Device Letters 2017, Volume: 38, Issue: 3, March 2017, Yong-Ha Song, Songbin Gong), when the first and second electrode fingers are viewed from a direction orthogonal to a direction in which the first and second electrode fingers extend, energy of the acoustic wave is likely to leak to the outer side portion of an intersecting portion in which the first and second electrode fingers overlap with each other. Therefore, there is a problem in that the resonance characteristics are deteriorated.

SUMMARY OF THE INVENTION

Preferred embodiments of the present invention provide acoustic wave devices, manufacturing methods for the same, high frequency front end circuits, and communication apparatuses including the acoustic wave device in each of which the deterioration in resonance characteristics does not occur, or only slightly occurs.

An acoustic wave device according to a preferred embodiment of the present invention is an end surface reflection acoustic wave device in which acoustic waves are reflected between a first end surface and a second end surface opposing each other, and the acoustic wave device includes a piezoelectric body including the first end surface and the second end surface, and a first principal surface and a second principal surface opposing each other and connecting the first end surface and the second end surface, a first electrode finger provided on the first principal surface of the piezoelectric body and extending in a second direction, when a direction in which the first end surface and the second end surface are connected is defined as a first direction and a direction orthogonal or substantially orthogonal to the first direction on the first principal surface is defined as the second direction, and a second electrode finger provided on the first principal surface of the piezoelectric body, provided separately from the first electrode finger with a gap interposed between the first electrode finger and the second electrode finger, and extending in the second direction on the first principal surface of the piezoelectric body. In a case that a portion where the first electrode finger and the second electrode finger overlap with each other when viewed from the first direction is defined as an intersecting portion, and a distance between the first end surface and the second end surface of the piezoelectric body is defined as a width of the piezoelectric body, the piezoelectric body is provided with a different width portion having a width different from the width of the piezoelectric body at a central portion of the intersecting portion in the second direction in a region where the first end surface and the second end surface oppose each other.

In an acoustic wave device according to a preferred embodiment of the present invention, the different width portion includes a thin width portion, and the thin width portion is smaller in width than the width of the piezoelectric body at the central portion.

In an acoustic wave device according to a preferred embodiment of the present invention, the thin width portion is provided in at least one of a first outer side portion and a second outer side portion of the intersecting portion in the second direction.

An acoustic wave device according to a preferred embodiment of the present invention further includes recessed portions opposing each other in the first direction at both of the first end surface and the second end surface of the piezoelectric body so as to have the thin width portion.

In an acoustic wave device according to a preferred embodiment of the present invention, the different width portion includes a thick width portion, and the thick width portion is larger in width than the width of the piezoelectric body at the central portion. In this case, a low acoustic velocity region may be provided in each of the first outer side portion and the second outer side portion of the central portion in the intersecting portion in the second direction.

In an acoustic wave device according to a preferred embodiment of the present invention, within the intersecting portion, the thick width portion is provided at each of a first end side and a second end side in the intersecting portion in the second direction. In this case, in a portion where the thick width portion is provided, a low acoustic velocity region in which the acoustic velocity is lower than an acoustic velocity in a portion other than the thick width portion may be provided.

In an acoustic wave device according to a preferred embodiment of the present invention, in the second direction, the first electrode finger is extended to the first outer side portion of the intersecting portion and the second electrode finger is extended to the second outer side portion of the intersecting portion, and there are further provided a first busbar and a second busbar connected to the first electrode finger and the second electrode finger respectively, and extended in a direction intersecting with the second direction.

In an acoustic wave device according to a preferred embodiment of the present invention, the different width portion includes a first thin width portion and a second thin width portion, the first thin width portion has a width smaller than the width of the piezoelectric body at the central portion, in the first outer side portion of the intersecting portion and at an inner side of the first busbar in the second direction, and the second thin width portion has a width smaller than the width of the piezoelectric body at the central portion, in the second outer side portion of the intersecting portion relative to the intersecting portion and at an inner side of the second busbar in the second direction. In this case, it is possible to reduce or prevent the leakage of energy of the acoustic wave toward outer side portions of the first and second thin width portions.

In an acoustic wave device according to a preferred embodiment of the present invention, the different width portion tapers in the second direction toward the outer side or the inner side. In this manner, a portion of the piezoelectric body having a different width may be provided so that the width gradually changes in the second direction.

In an acoustic wave device according to a preferred embodiment of the present invention, a plurality of at least one of the first electrode finger and the second electrode finger are provided.

In an acoustic wave device according to a preferred embodiment of the present invention, the piezoelectric body is a piezoelectric film, and further includes a support member including a support surface supporting the piezoelectric film and provided with a recessed portion on the support surface, and the piezoelectric film is fixed to the support member in such a manner that at least the intersecting portion of the piezoelectric film is located on or above the recessed portion with respect to the support member. In this case, a membrane acoustic wave device may be provided.

An acoustic wave device according to a preferred embodiment of the present invention further includes a support member that supports the piezoelectric body, and the support member includes a high acoustic velocity material layer in which a bulk wave propagates at a higher acoustic velocity than the acoustic velocity of an acoustic wave propagating in the piezoelectric body. In this case, the energy of the acoustic wave is able to be effectively confined to the portion up to the high acoustic velocity material layer.

In an acoustic wave device according to a preferred embodiment of the present invention, the support member includes a low acoustic velocity material layer which is provided closer to the piezoelectric body side than the high acoustic velocity material layer, and in which a bulk wave propagates at a lower acoustic velocity than the acoustic velocity of an acoustic wave propagating in the piezoelectric body. In this case, the energy of the acoustic wave is able to be more effectively confined to the piezoelectric body side than the low acoustic velocity material layer.

In an acoustic wave device according to a preferred embodiment of the present invention, the support member is a high acoustic velocity substrate defined by the high acoustic velocity material layer. In this case, both the function of the high acoustic velocity material layer and the function of supporting the piezoelectric body are performed.

An acoustic wave device according to a preferred embodiment of the present invention further includes a support member that supports the piezoelectric body, and the support member includes a low acoustic impedance layer having a relatively low acoustic impedance and a high acoustic impedance layer having a relatively high acoustic impedance. In this case as well, the energy of the acoustic wave is able to be effectively confined to the piezoelectric body side.

A high frequency front end circuit according to a preferred embodiment of the present invention includes an acoustic wave device according to a preferred embodiment of the present invention, and a power amplifier.

A communication apparatus according to a preferred embodiments of the present invention includes a high frequency front end circuit according to a preferred embodiment of the present invention, and an RF signal processing circuit.

A manufacturing method for an acoustic wave device according to a preferred embodiment of the present invention includes processing the piezoelectric body so as to provide the different width portion in which a width of the piezoelectric body is partially different; and providing the first and second electrode fingers on the first principal surface of the piezoelectric body.

With the acoustic wave devices and the manufacturing methods of the acoustic wave devices according to preferred embodiments of the present invention, deterioration in resonance characteristics is able to be effectively reduced or prevented in an end surface reflection acoustic wave device. Therefore, it is possible to provide acoustic wave devices, high frequency front end circuits, and communication apparatuses that have excellent characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the accompanying drawings.

It should be noted that the respective preferred embodiments described herein are illustrative and that partial substitutions or combinations of configurations may be made between the different preferred embodiments.

Figure 1:
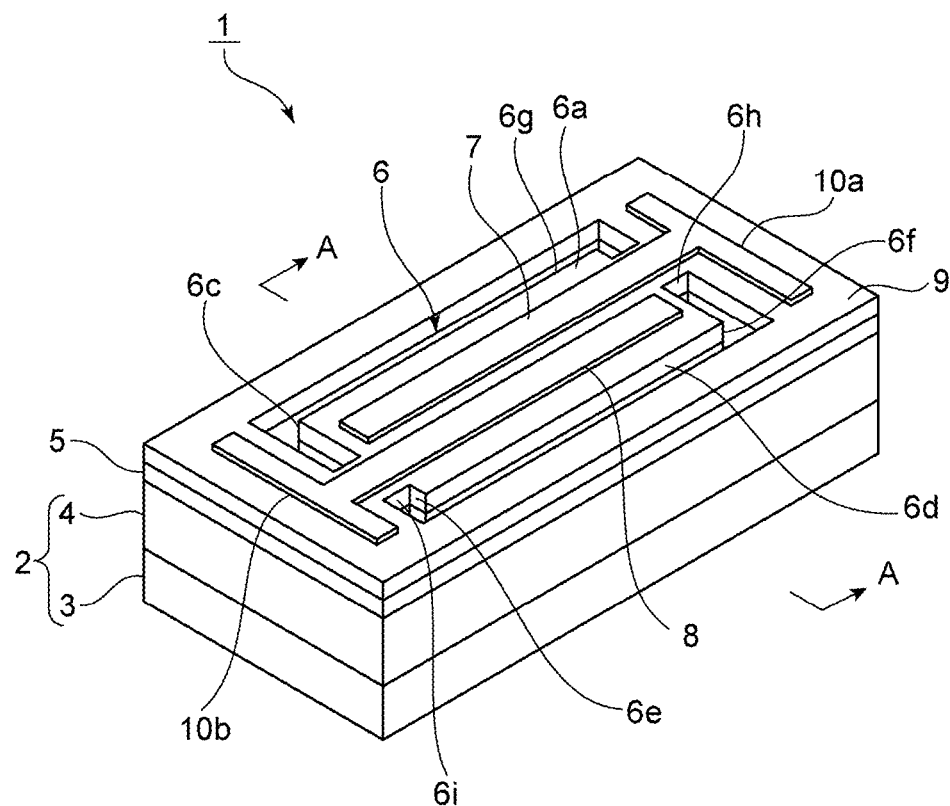
FIG. 1 is a perspective view of an acoustic wave device according to a first preferred embodiment of the present invention.
Figure 2:
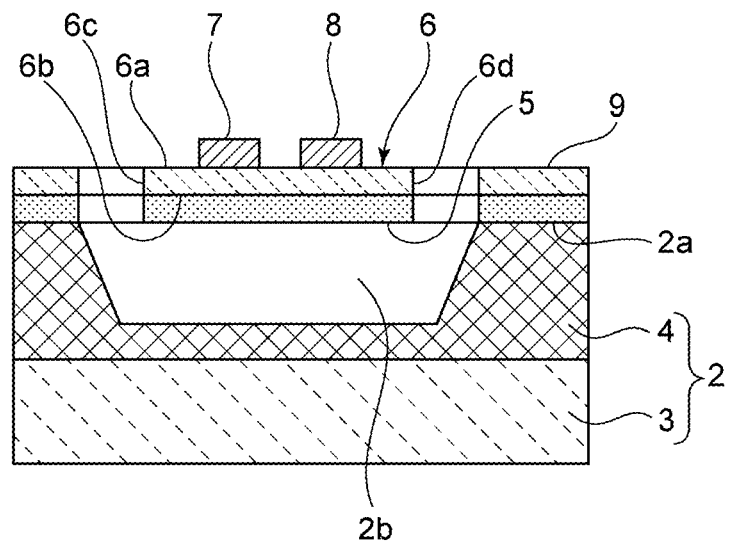
FIG. 2 is a cross-sectional view of a portion along a line A-A in FIG. 1.

FIG. 1 is a perspective view of an acoustic wave device according to a first preferred embodiment of the present invention, and FIG. 2 is a cross-sectional view of a portion along a line A-A in FIG. 1.

As illustrated in FIG. 1, a dielectric layer 5 and a piezoelectric body 6 are preferably laminated on a support member 2. The support member 2 includes a support substrate 3 and an insulation layer 4 laminated on the support substrate 3. As illustrated in FIG. 2, a recessed portion 2b is provided on an upper surface 2a of the support member 2.

The support substrate 3 is preferably made of a suitable insulating material, semiconductor material, or the like, for example. In addition, in the present preferred embodiment, the insulation layer 4 is preferably made of silicon oxide, for example. Note that, however, the insulating material used to make the insulation layer 4 is not particularly limited.

The dielectric layer 5 is preferably made of silicon oxide, for example. However, the dielectric layer 5 may be made of another dielectric material. A piezoelectric film is laminated on the dielectric layer 5 as the piezoelectric body 6. In the present preferred embodiment, the piezoelectric body 6 is preferably made of $LiNbO_3$, for example. Note that, however, the piezoelectric body 6 may be made of another piezoelectric single crystal such as $LiTaO_3$, or may be made of piezoelectric ceramics, for example.

The piezoelectric body 6 is connected to a frame portion 9, which is preferably made of the same material as the piezoelectric body 6. That is, the piezoelectric body 6 preferably includes a vibration body portion 6g having a rectangular or substantially rectangular shape, an anchor portion 6h connected to one end of the vibration body portion 6g, and an anchor portion 6i connected to the other end thereof. The anchor portions 6h and 6i are connected to the frame portion 9.

The piezoelectric body 6 includes first and second principal surfaces 6a and 6b opposing each other, and first and second end surfaces 6c and 6d opposing each other. Here, the piezoelectric body 6 preferably has a rectangular or substantially rectangular plate shape. Therefore, the piezoelectric body 6 includes the first and second principal surfaces 6a and 6b opposing each other, the first and second end surfaces 6c and 6d opposing each other, and a pair of side surfaces opposing each other. Here, the principal surface refers to a surface having the largest area among the principal surface, the end surface, and the side surface. On the other hand, the first and second end surfaces 6c and 6d connect the first principal surface 6a and the second principal surface 6b. Then, acoustic waves are reflected at the first and second end surfaces 6c and 6d, thus obtaining characteristics. That is, since the acoustic wave device is an end surface reflection acoustic wave device, the surfaces at which the acoustic waves are reflected to obtain the above-mentioned characteristics are referred to as end surfaces.

First and second electrode fingers 7 and 8 are provided on the first principal surface 6a. The first electrode finger 7 and the second electrode finger 8 extend in parallel or substantially in parallel to each other. A direction orthogonal or substantially orthogonal to a direction in which the first and second electrode fingers 7 and 8 extend (or a direction in which the first end surface 6c and the second end surface 6d are connected) is an acoustic wave propagation direction, and this direction is referred to as a first direction. The direction in which the first and second electrode fingers 7 and 8 extend is referred to as a second direction.

In the acoustic wave device 1, a portion where the first and second electrode fingers 7 and 8 overlap with each other when viewed from the first direction is an intersecting portion. The dimension of the intersecting portion along the second direction is an intersecting width.

A distance between the first end surface and the second end surface in the piezoelectric body 6 is defined as a width of the piezoelectric body 6. The piezoelectric body 6 includes the anchor portions 6h and 6i as different width portions each having a width different from the width of the piezoelectric body at a central portion of the intersecting portion in the second direction in a region where the first end surface and the second end surface oppose each other. The anchor portions 6h and 6i are preferably thin width portions as the different width portions in the present preferred embodiment. More specifically, the anchor portions 6h and 6i are first and second thin width portions in the present preferred embodiment. One end of the anchor portion 6h and one end of the anchor portion 6i are extended to side surfaces 6f and 6e of the vibration body portion 6g.

In the present preferred embodiment, the different width portion is a thin width portion. However, in the present invention, the different width portion may alternatively be a thick width portion, which is wider than the width of the piezoelectric body at the central portion in the intersecting portion in the second direction.

The dielectric layer 5 preferably extends not only to the rectangular vibration body portion 6g, but also to the anchor portions 6h and 6i, and a lower surface of the frame portion 9.

The piezoelectric body 6 and the dielectric layer 5 laminated on the piezoelectric body 6 are integrated on the recessed portion 2b. However, since the piezoelectric body 6 is connected to the frame portion 9 with the anchor portions 6h and 6i, the piezoelectric body 6 is maintained in a floating state. The frame portion 9 and the dielectric layer 5 under the frame portion 9 are fixed on the upper surface 2a of the support member 2.

The acoustic wave device 1 of the present preferred embodiment uses a plate wave. The "plate wave" is a generic term for various waves excited in a piezoelectric body having a film thickness of equal to or smaller than about 1λ, when the wave length of the excited plate wave is about 1λ. Any technique may be used as long as the waves are able to be confined in a thin plate of the piezoelectric body. That is, a membrane acoustic wave device may be used in which the piezoelectric body 6 is floated as in the present preferred embodiment. Alternatively, such a structure may be used in which an acoustic reflection film, a high acoustic velocity material layer, and/or a low acoustic velocity material layer to be described later is laminated on a thin plate made of a piezoelectric body.

In the present preferred embodiment, since the plate wave is used, the thickness of the piezoelectric body 6 is preferably about 0.1 μm to about 2 μm, for example. That is, the piezoelectric body 6 is made of a relatively thin piezoelectric film, and the overall vibration body portion 6g vibrates.

In the case of the membrane acoustic wave device, the plate wave is confined only in the piezoelectric body 6. In this case, the plate wave is classified into a Lamb wave and a shear horizontal (SH) wave in accordance with displacement components. Further, the Lamb wave is classified into a symmetric mode (S mode) and an antisymmetric mode (A mode).

The acoustic wave device 1 is preferably an end surface reflection acoustic wave device. At the first end surface 6c and the second end surface 6d opposing each other, the plate wave is reflected, thus obtaining resonance characteristics. Further, since the thin piezoelectric body 6 is used and the plate wave is used, a high frequency is able to be easily supported.

The first electrode finger 7 is extended outward in the second direction from the intersecting portion to be connected to a first busbar 10a provided on the frame portion 9.

The second electrode finger 8 is extended outward in the second direction from the intersecting portion to be connected to a second busbar 10b.

The first and second electrode fingers 7, 8 and the first and second busbars 10a, 10b are made of a suitable metal or alloy. A laminated metal film provided by laminating a plurality of metal films made of a suitable metal or alloy may also be used.

A feature of the acoustic wave device 1 is such that, when a portion where the first electrode finger 7 and the second electrode finger 8 overlap with each other is the intersecting portion, and a distance between the first end surface and the second end surface in the piezoelectric body 6 is the width of the piezoelectric body, the piezoelectric body 6 is provided with the different width portion having a width different from the width of the piezoelectric body at the central portion of the intersecting portion in the second direction in a region where the first end surface and the second end surface oppose each other.

The term "anchor" in the anchor portions 6h and 6i refers to a portion connecting the intersecting portion that excites acoustic waves to the frame portion 9. In the end surface reflection acoustic wave device 1, since the thin width portions, which are the different width portions, defined of the anchor portions 6h and 6i are provided, the resonance characteristics are able to be improved. This will be described with reference to FIGS. 3 to 5 in addition to FIGS. 1 and 2.

Figure 3:
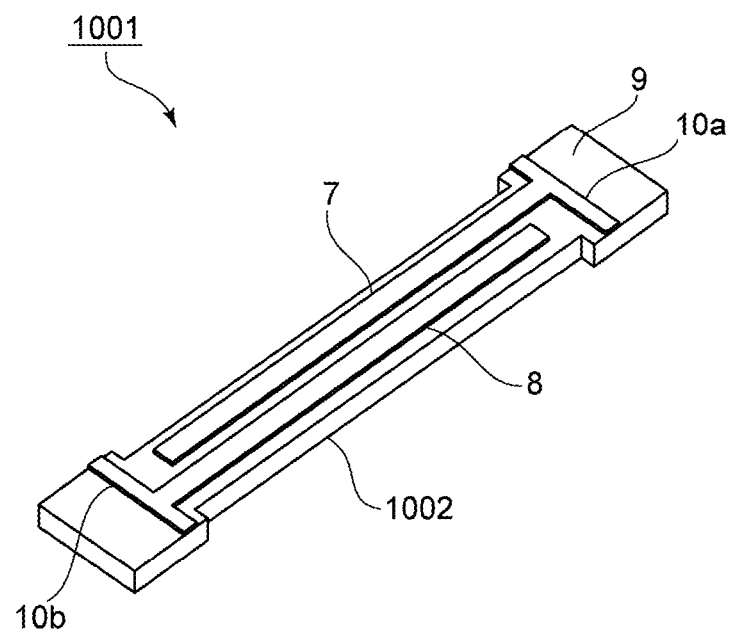
FIG. 3 is a perspective view illustrating a main section of an acoustic wave device of a comparative example.

FIG. 3 is a perspective view illustrating a main section of an acoustic wave device of a comparative example. An acoustic wave device 1001 of the comparative example is configured similarly to the acoustic wave device 1 of the first preferred embodiment, except that a piezoelectric body 1002 does not include any different width portion.

Figure 4:
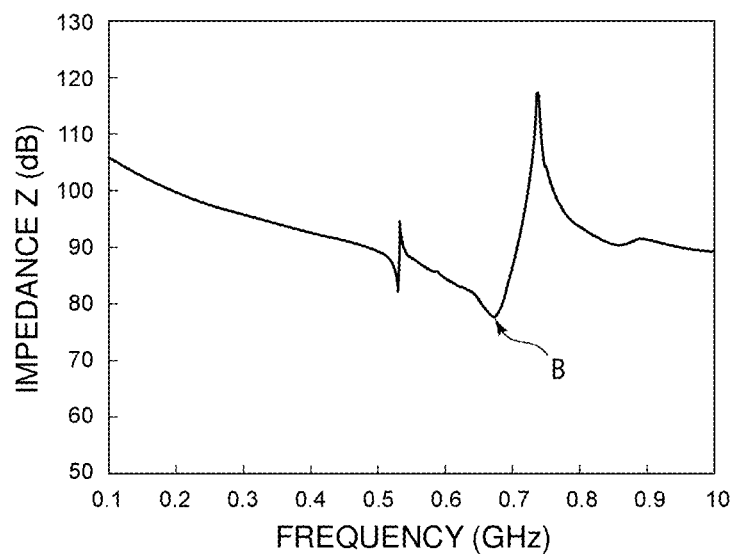
FIG. 4 is a graph showing resonance characteristics of the acoustic wave device of the comparative example.
Figure 5:
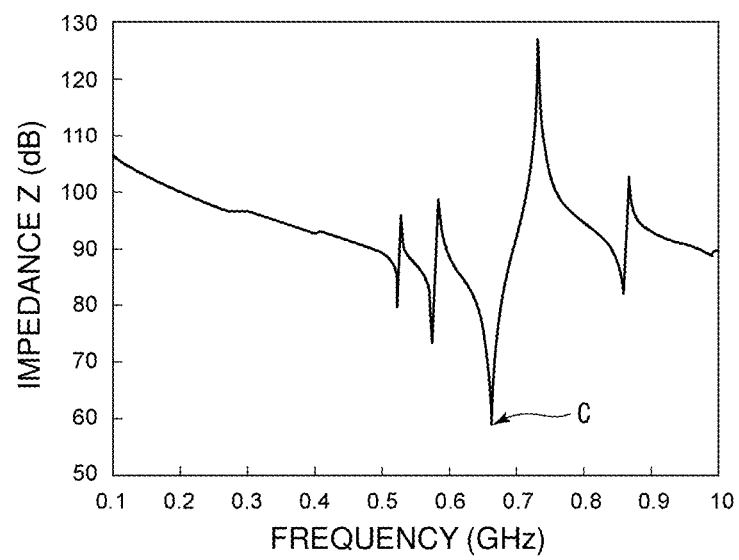
FIG. 5 is a graph showing resonance characteristics of the acoustic wave device of the first preferred embodiment of the present invention.

FIG. 4 is a graph showing resonance characteristics of the acoustic wave device 1001 of the comparative example. FIG. 5 is a graph showing resonance characteristics of the acoustic wave device 1 of the first preferred embodiment.

In both the first preferred embodiment and the comparative example, $LiNbO_3$ with Euler angles (90°, 90°, 170°) and a thickness of about 800 nm, was used as a piezoelectric material for the graph of FIGS. 4 and 5. Further, an Au film having a thickness of about 100 nm was used as an electrode material. The intersecting width was about 14.8 μm, and in the first preferred embodiment, the width of the piezoelectric body 6 in the intersecting portion was about 2.8 μm, and the width of the anchor portions 6h and 6i was about 2.66 μm.

As indicated by an arrow B in FIG. 4, in the acoustic wave device 1001 of the comparative example, it is understood that the peak at the resonance point is shaped to be dull (i.e., does not come to a sharp point), and the impedance at the resonant frequency is high. Accordingly, the impedance ratio, which is a ratio of the impedance at the anti-resonant frequency to the resonant frequency, is small.

On the other hand, as indicated by an arrow C in FIG. 5, the impedance at the resonant frequency is sufficiently small in the acoustic wave device 1 of the first preferred embodiment. Accordingly, it is understood that favorable resonance characteristics are obtained, and that the impedance ratio is increased.

As described above, the reason for the improvement in the resonance characteristics of the acoustic wave device 1 of the first preferred embodiment may be as follows: the width of the piezoelectric body 6 at the anchor portions 6h and 6i is thinner than the width of the piezoelectric body 6 at the central portion of the intersecting portion in the second direction.

That is, since the width of the anchor portions 6h and 6i, which are the different width portions, is different from the width of the piezoelectric body 6 at the central portion of the intersecting portion in the second direction, a difference in acoustic velocity of the acoustic wave is generated so that the energy of the acoustic wave reflected between the first end surface 6c and the second end surface 6d becomes unlikely to leak from the anchor portions 6h and 6i, which are the different width portions, toward the frame portion 9 side.

As described above, the present preferred embodiment is a membrane acoustic wave device in which the piezoelectric body 6 is floated. On the other hand, in the case of using a plate wave, a support substrate made of acoustic reflection films, material layers of different acoustic velocities, or the like may be laminated. However, the membrane acoustic wave device is preferable. In the membrane acoustic wave device, the energy of the plate wave hardly leaks to the outside of the piezoelectric body 6.

A non-limiting example of a manufacturing method of the acoustic wave device 1 will be described with reference to FIGS. 6A to 6C, FIGS. 7A to 7C, and FIGS. 8A to 8C.

Figure 6A:
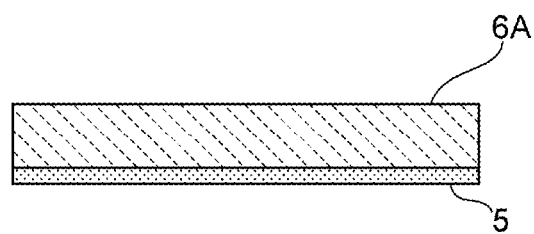
FIGS. 6A to 6C are front cross-sectional views that explain a manufacturing method of the acoustic wave device of the first preferred embodiment of the present invention.
Figure 6B:
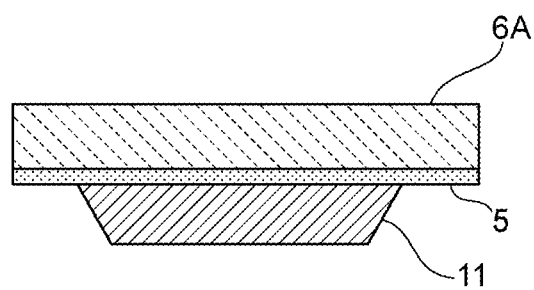

As illustrated in FIG. 6A, a piezoelectric plate 6A is prepared. A silicon oxide film is formed as the dielectric layer on one surface of the piezoelectric plate 6A. Next, as illustrated in FIG. 6B, a sacrificial layer 11 is provided on the dielectric layer 5. As the sacrificial layer 11, an appropriate material removable by an etchant to be described later may be used.

Figure 6C:
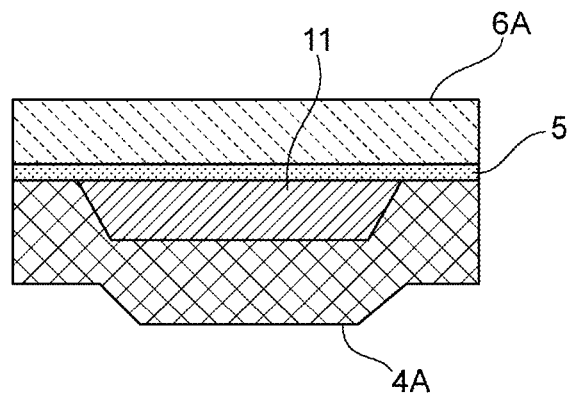
Figure 7A:
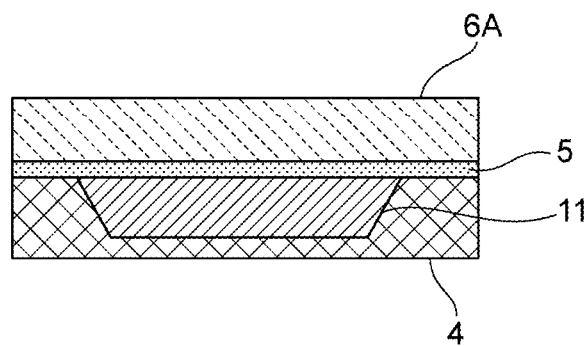
FIGS. 7A to 7C are front cross-sectional views that explain the manufacturing method of the acoustic wave device of the first preferred embodiment of the present invention.
Figure 7B:
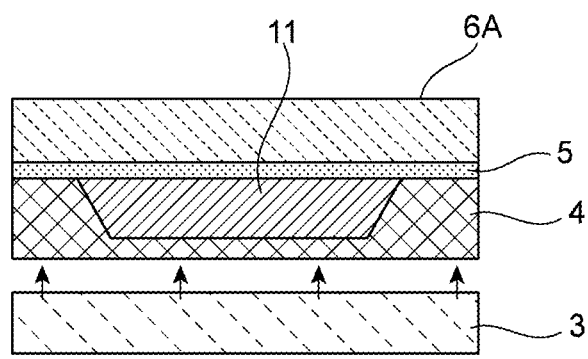

As illustrated in FIG. 6C, a silicon oxide film 4A is formed so as to cover the sacrificial layer 11. Next, an outer-side principal surface of the silicon oxide film 4A is flattened by polishing or the like so as to form the insulation layer 4 illustrated in FIG. 7A. Subsequently, as illustrated in FIG. 7B, the support substrate 3 is adhered to the insulation layer 4.

Figure 7C:
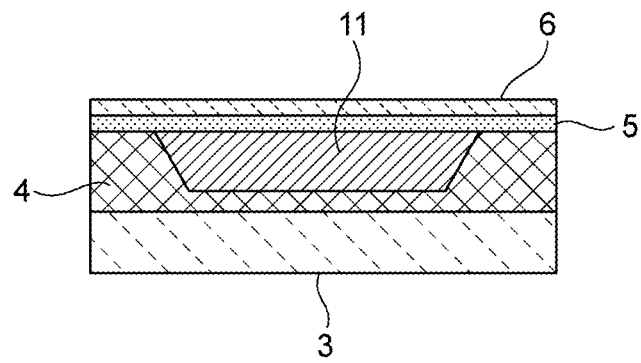

Next, the piezoelectric plate 6A is polished to be thinned. In this manner, as illustrated in FIG. 7C, the piezoelectric body 6 is formed. The piezoelectric body 6 preferably has a thickness of equal to or smaller than about 1 μm, for example. Since the piezoelectric body 6 is very thin, it is able to be easily removed by dry etching.

Figure 8A:
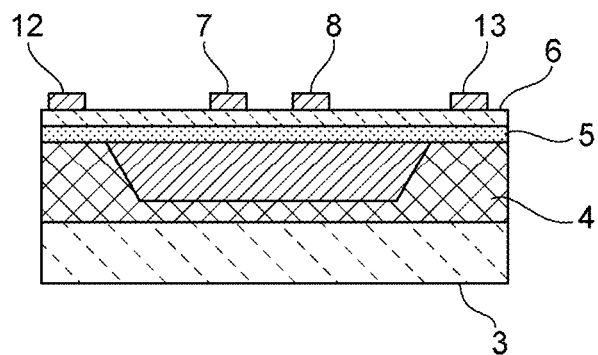
FIGS. 8A to 8C are front cross-sectional views that explain the manufacturing method of the acoustic wave device of the first preferred embodiment of the present invention.

As illustrated in FIG. 8A, the first and second electrode fingers 7 and 8, and wirings 12 and 13 are formed on the piezoelectric body 6. The wirings 12 and 13 are provided in outer side portions not illustrated in FIG. 1.

Figure 8B:
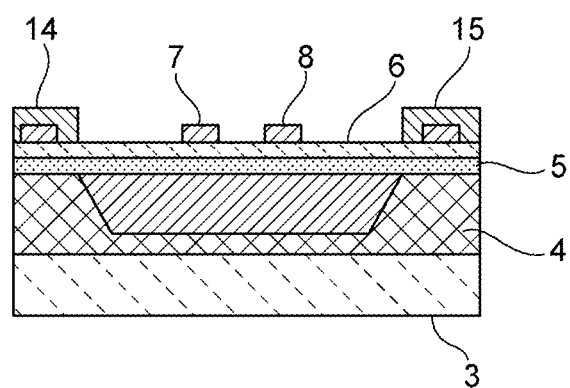

Subsequently, as illustrated in FIG. 8B, wiring layers 14 and 15 of a second layer are formed so as to cover the wirings 12 and 13, respectively.

Figure 8C:
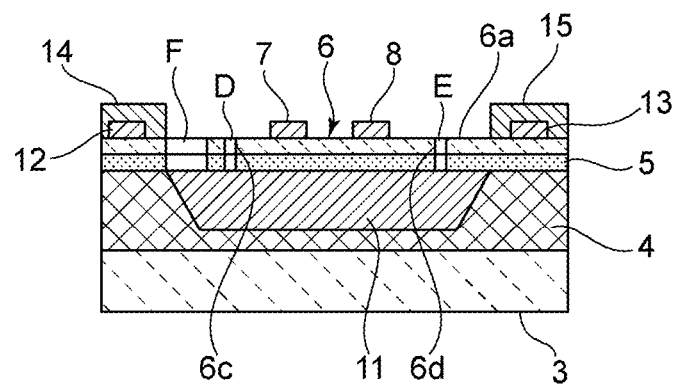

Next, as illustrated in FIG. 8C, grooves D, E and a sacrificial layer etching hole F are provided by etching. This etching may preferably be performed by dry etching, for example. However, the etching may be wet etching. As described above, since the piezoelectric body 6 has a small thickness of equal to or smaller than about 1 μm, for example, the grooves D, E and the sacrificial layer etching hole F are able to be formed with ease by etching. By forming the grooves D and E, the first and second end surfaces 6c and 6d illustrated in FIG. 1 are exposed.

Next, the sacrificial layer 11 is removed by using the etchant to dissolve the sacrificial layer 11. In this manner, the acoustic wave device 1 is able to be obtained.

As described above, in the acoustic wave device 1, by removing the sacrificial layer 11, a membrane structure in which the thin piezoelectric body 6 and the dielectric layer 5 are laminated is able to be obtained.

It is not absolutely necessary to provide the dielectric layer 5. However, by providing a silicon oxide film or the like as the dielectric layer 5, the absolute value of a temperature coefficient of frequency TCF is able to be decreased. Therefore, it is possible to improve the temperature characteristics. A protective film or a frequency adjustment film may be provided so as to cover the first and second electrode fingers 7 and 8. As such a protective film or a frequency adjusting film, a silicon nitride film, or the like may preferably be used, for example.

In the dry etching, one or more than one type of gases such as argon gas, fluorine gas, chlorine gas, and the like, for example, may be used as the etching gas. Further, the first and second end surfaces 6c and 6d are formed by forming the grooves D and E by the dry etching. The different width portions of the piezoelectric body 6, such as the above-discussed anchor portions 6h and 6i, may be simultaneously formed at the time of etching. Therefore, in the acoustic wave device 1, the different width portion is able to be provided without increasing the number of processes.

In manufacturing the acoustic wave device 1, the process of providing the first and second electrode fingers 7 and 8 may be performed after the etching.

As is apparent from the above-discussed manufacturing method, regions of different acoustic velocities are able to be provided only by providing the different width portions in the piezoelectric body.

As for interdigital transducer (IDT) electrodes, a structure in which low acoustic velocity regions are provided on a first end side and a second end side of the intersecting portion, and the piston mode is used has been known. Such a low acoustic velocity region has been defined by providing a thick width portion in which the width of an electrode finger is widened, or by employing a structure in which a material for reducing the acoustic velocity is laminated on the electrode finger, for example. However, in the structure in which the thick width portion is provided in the electrode finger, since there is a restriction on the duty, it is difficult to provide the thick width portion having a sufficiently wide width. On the other hand, with the structure in which another material is laminated on the electrode finger, the number of processes is increased, and there is a risk that a positional shift between the material layer to be laminated and the electrode finger may occur. Therefore, the tolerance in the desired structure is small. In contrast, in the structure in which the different width portion is provided as in the present invention, regions of different acoustic velocities are able to be easily provided, and a sufficient difference in acoustic velocity is able to be provided.

Figure 9:
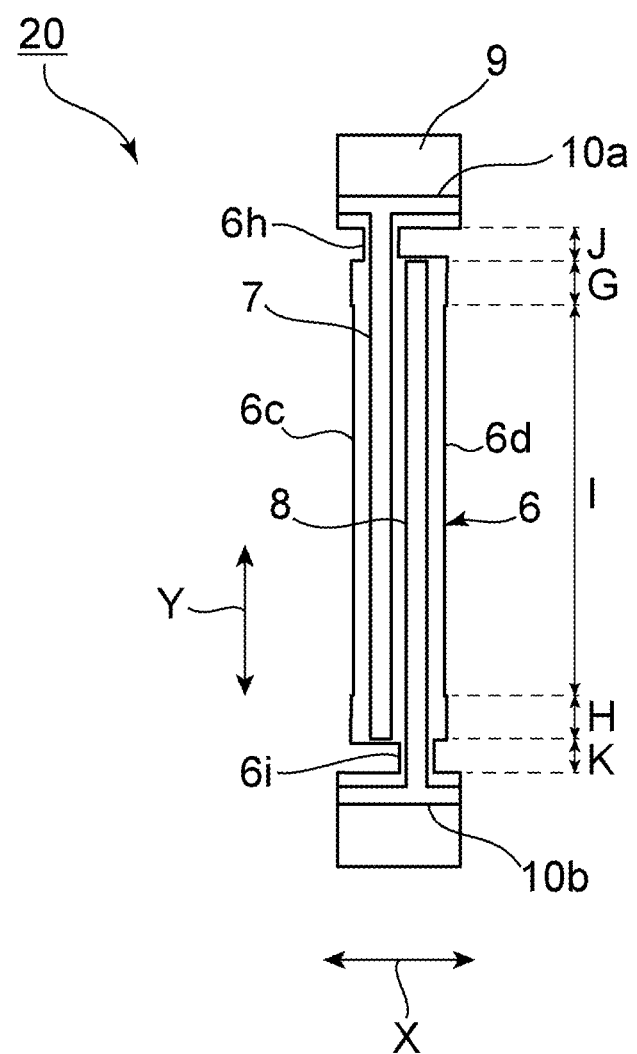
FIG. 9 is a plan view illustrating a main section of an acoustic wave device according to a second preferred embodiment of the present invention.

FIG. 9 is a plan view illustrating a main section of an acoustic wave device 20 according to a second preferred embodiment of the present invention. The acoustic wave device 20 according to the second preferred embodiment includes two kinds of different width portions. The different width portions of the first kind are thick width portions G and H whose widths are larger than a width of a piezoelectric body 6 at a central portion of the intersecting portion in the second direction. The different width portions of the second kind are thin width portions whose widths are smaller than the width of the piezoelectric body 6 at the central portion of the intersecting portion in the second direction. The thin width portions are anchor portions 6h and 6i. That is, the anchor portions 6h and 6i are preferably configured in the same or substantially the same manner as those in the first preferred embodiment. On the other hand, as for the thick width portions G and H, the widths thereof are larger than the width of the piezoelectric body 6 at the central portion of the intersecting portion in the second direction, while other configurations are the same as or similar to those of the acoustic wave device 1. That is, although not illustrated in FIG. 9, a frame portion 9 preferably has a rectangular or substantially rectangular frame shape, and a dielectric layer 5 is laminated under the piezoelectric body 6. Note that the present preferred embodiment is a membrane acoustic wave device including a support member 2.

As in the acoustic wave device 20 of the second preferred embodiment, by providing, as the different width portions, both the thick width portions G, H and the anchor portions 6h, 6i as the thin width portions, it is possible to increase a difference in acoustic velocity between the thick width portions G, H and the anchor portions 6h, 6i.

Figure 10A:
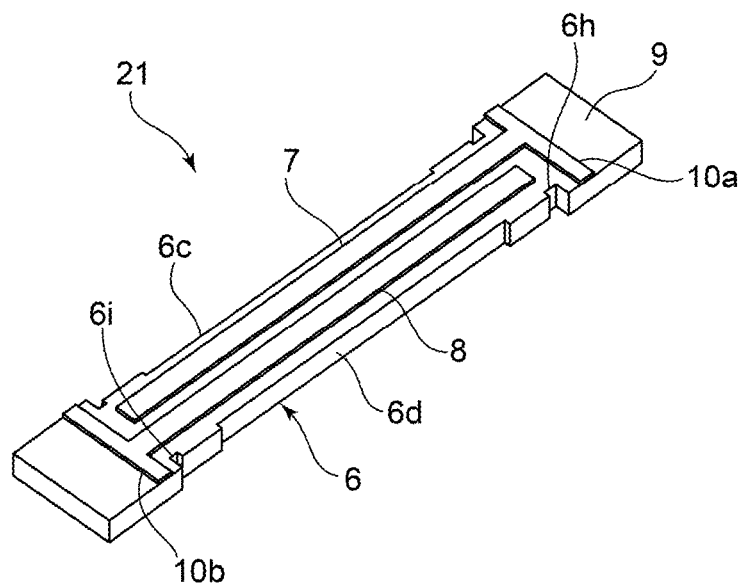
FIGS. 10A and 10B are a perspective view and a plan view, respectively, illustrating a main section of an acoustic wave device according to a third preferred embodiment of the present invention.
Figure 10B:
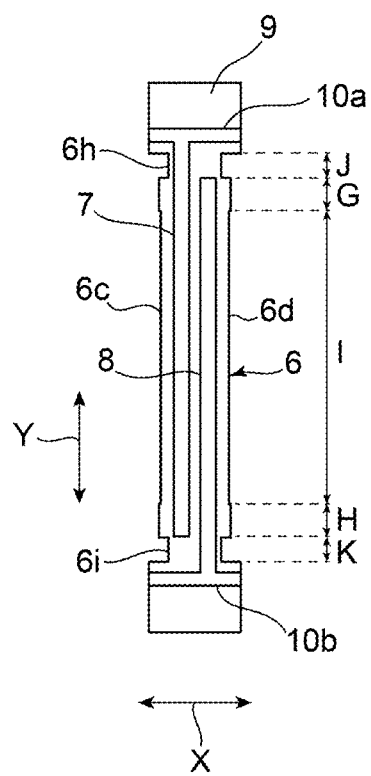

FIGS. 10A and 10B are a perspective view and a plan view, respectively, illustrating a main section of an acoustic wave device 21 according to a third preferred embodiment. In the acoustic wave device 21, the width of a piezoelectric body 6 at thick width portions G and H illustrated in FIG. 10B, is larger than the width of the piezoelectric body 6 at a central portion of the intersecting portion in the second direction. That is, the intersecting portion includes a center portion I interposed between the thick width portions G and H, and the thick width portions G and H. In other words, the dimension between a first end surface 6c and a second end surface 6d is larger at the thick width portions G and H than that at the center portion I as the central portion in the second direction. The width of the piezoelectric body 6 at the anchor portions 6h and 6i is smaller than that at the center portion I. Table 1 below shows a preferred length and a width of each portion of the piezoelectric body 6 in the acoustic wave device 21 of the third preferred embodiment. That is, regarding a reference symbol for each portion, as illustrated in FIG. 10B, a portion between the thick width portion G and thick width portion H is the center portion I. A portion where one anchor portion, that is, the anchor portion 6h is present is a portion J, and a portion where the other anchor portion, that is, the anchor portion 6i is present is a portion K. The width of each of the portions J and K where the anchor portions 6h and 6i are present is defined as W1, the widths of the thick width portions G and H are defined as W2 and W4 respectively, and the width of the center portion I is defined as W3.

The unit in Table 1 is μm.

TABLE 1

| Unit: μm | Third preferred embodiment | |
|---|---|---|
| Region | Length | Width |
| Portion J | 8.4 | 2.66 |
| Thick width portion G | 0.9 | 2.94 |
| Center portion I | 13 | 2.80 |
| Thick width portion H | 0.9 | 2.94 |
| Portion K | 8.4 | 2.66 |

The acoustic wave device 21 is preferably similar to the acoustic wave device of the first preferred embodiment except for the above-described main section. That is, in practice, a frame portion 9 preferably has a rectangular or substantially rectangular frame shape, and a dielectric layer 5 is laminated under the piezoelectric body 6. Further, the acoustic wave device 21 is a membrane acoustic wave device using a support member 2.

Figure 11:
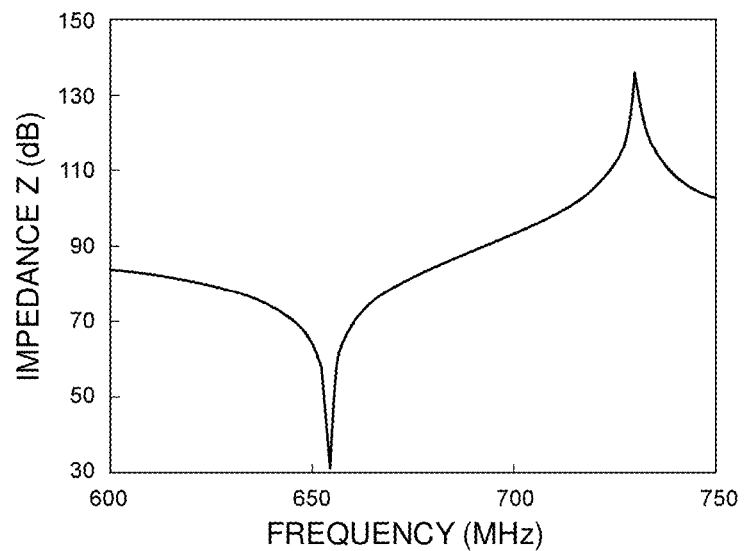
FIG. 11 is a graph showing resonance characteristics of the acoustic wave device of the third preferred embodiment of the present invention.

FIG. 11 shows resonance characteristics of the acoustic wave device of the third preferred embodiment. As is apparent from FIG. 11, a high impedance ratio of about 101 dB is exhibited, and good resonance characteristics are obtained.

In the thick width portions G and H, a distance between the first end surface 6c and the second end surface 6d is large, so that the acoustic velocity is able to be decreased. That is, low acoustic velocity regions are able to be provided in outer side portions of the center portion I in the second direction.

Next, fourth and fifth preferred embodiments of the present invention will be described below. An acoustic wave device of the fourth preferred embodiment was obtained in the same or similar manner as the acoustic wave device of the third preferred embodiment, except that lengths and widths of a center portion, thick width portions, and anchor portions were changed as shown in Table 2 below. For comparison, an acoustic wave device of a second comparative example in which the width of each portion in the piezoelectric body is constant was prepared as shown in Table 2.

TABLE 2

| Unit: μm | Fourth preferred embodiment | | Second comparative example | |
|---|---|---|---|---|
| Region | Length | Width | Length | Width |
| Portion J | 5.6 | 2.80 | 0.5 | 2.80 |
| Thick width portion G | 0.9 | 2.94 | 1.1 | 2.80 |
| Center portion I | 13 | 2.80 | 12.6 | 2.80 |
| Thick width portion H | 0.9 | 2.94 | 1.1 | 2.80 |
| Portion K | 5.6 | 2.80 | 0.5 | 2.80 |

Figure 12:
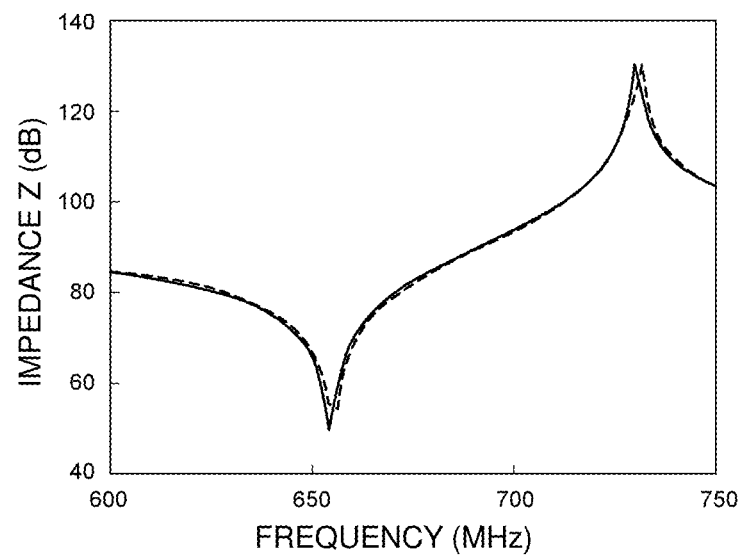
FIG. 12 is a graph showing resonance characteristics of an acoustic wave device of a fourth preferred embodiment of the present invention and those of an acoustic wave device of a second comparative example.

A solid line in FIG. 12 shows resonance characteristics of the fourth preferred embodiment, and a broken line shows resonance characteristics of the second comparative example. As is apparent from FIG. 12, in the fourth preferred embodiment, a ratio of W2 to W3 was about 1.05, and the impedance ratio in the resonance characteristics was about 85 dB. In contrast, in the second comparative example, the impedance ratio is about 77 dB at most. Accordingly, also in the fourth preferred embodiment, it is understood that good resonance characteristics are able to be obtained.

That is, it is understood that, by making the ration of W2 to W3 larger than one, the impedance ratio is able to be effectively increased.

Table 3 below shows dimensions of respective portions of an acoustic wave device of the fifth preferred embodiment and an acoustic wave device of a third comparative example. In the present preferred embodiment, portions extending in the second direction from outer-side ends of a center portion I to anchor portions 6h and 6i are denoted by the symbols G and H respectively in the same or similar manner as in the third preferred embodiment, so as to be represented as a portion G and a portion H.

TABLE 3

| Unit: μm | Fifth preferred embodiment | | Third comparative example | |
|---|---|---|---|---|
| Region | Length | Width | Length | Width |
| Portion J | 5.6 | 2.52 | 5.6 | 2.80 |
| Portion G | 0.9 | 2.66 | 0.9 | 2.80 |
| Center portion I | 13 | 2.8 | 13 | 2.80 |
| Portion H | 0.9 | 2.66 | 0.9 | 2.80 |
| Portion K | 5.6 | 2.52 | 5.6 | 2.80 |

In the fifth preferred embodiment, W1/W2/W3 is 0.90/0.95/1.0. In the third comparative example, W1/W2/W3 is 1.0/1.0/1.0.

Figure 13:
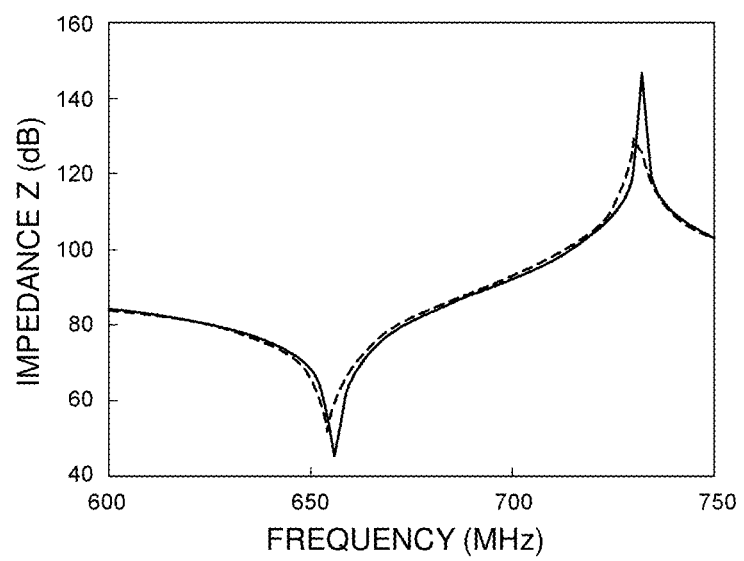
FIG. 13 is a graph showing resonance characteristics of an acoustic wave device of a fifth preferred embodiment of the present invention and those of an acoustic wave device of a third comparative example.

FIG. 13 shows resonance characteristics of the acoustic wave devices of the fifth preferred embodiment and the third comparative example. A solid line shows a result of the fifth preferred embodiment, and a broken line shows a result of the third comparative example. As shown in FIG. 13, in the fifth preferred embodiment, a high impedance ratio of about 101 dB is exhibited, and in the third comparative example, the impedance ratio is about 77 dB at most. Therefore, it is understood that better resonance characteristics are able to be obtained by establishing a relation of W1<W2/W3.

Figure 14:
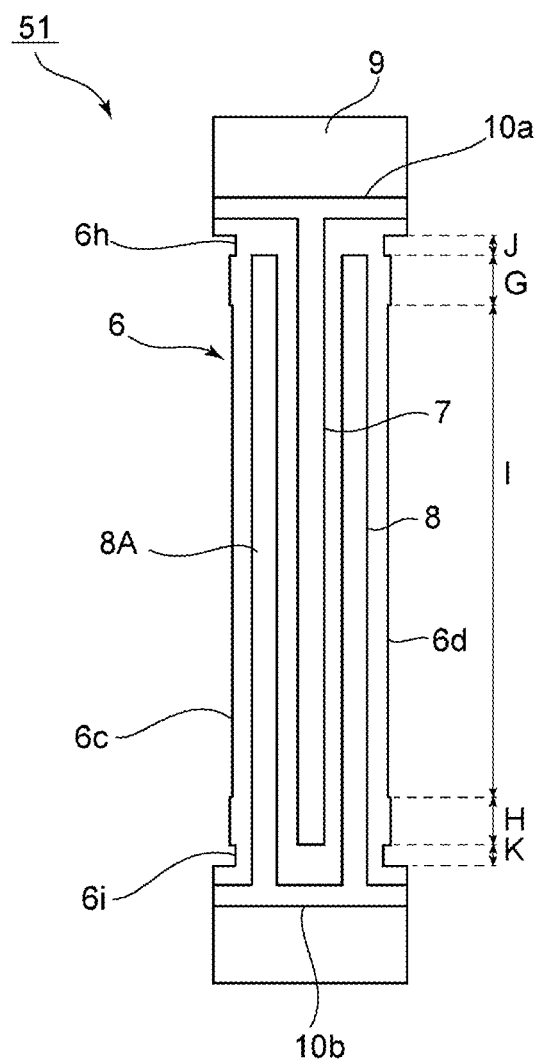
FIG. 14 is a plan view illustrating a main section of an acoustic wave device according to a sixth preferred embodiment of the present invention.

FIG. 14 is a plan view illustrating a main section of an acoustic wave device according to a sixth preferred embodiment of the present invention. In the sixth preferred embodiment, second electrode fingers 8 and 8A are provided on both sides of a first electrode finger 7. That is, a plurality of second electrode fingers 8 and 8A are provided. As in an acoustic wave device 51, a plurality of at least one of the first electrode finger and the second electrode finger may be provided.

Other structures of the acoustic wave device 51 are preferably similar to those of the acoustic wave device 1 of the first preferred embodiment. In FIG. 14, only a main section of a membrane piezoelectric body 6 is illustrated in a plan view.

Table 4 below shows a length and a width of each portion in the acoustic wave device 51 of the sixth preferred embodiment. For comparison, a length and a width of each portion in an acoustic wave device of a fourth comparative example are also shown.

Note that the acoustic wave device of the fourth comparative example is the same or substantially the same as the acoustic wave device 51 of the sixth preferred embodiment, except that the width of the piezoelectric body is uniform.

Figure 15:
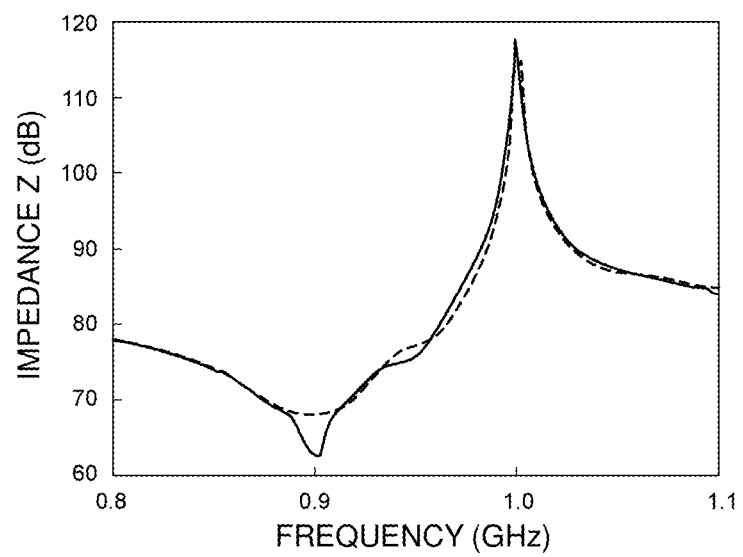
FIG. 15 is a graph showing resonance characteristics of the acoustic wave device of the sixth preferred embodiment of the present invention and those of an acoustic wave device of a fourth comparative example.

A solid line in FIG. 15 shows resonance characteristics of the sixth preferred embodiment, and a broken line shows resonance characteristics of the fourth comparative example.

TABLE 4

| Unit: μm | Sixth preferred embodiment | | Fourth comparative example | |
| --- | --- | --- | --- | --- |
| Region | Length | Width | Length | Width |
| Portion J | 0.5 | 3.79 | 0.5 | 3.95 |
| Thick width portion G | 1.1 | 4.11 | 1.1 | 3.95 |
| Center portion I | 12.6 | 3.95 | 12.6 | 3.95 |
| Thick width portion H | 1.1 | 4.11 | 1.1 | 3.95 |
| Portion K | 0.5 | 3.79 | 0.5 | 3.95 |

In the acoustic wave device 51 of the sixth preferred embodiment, a ratio of W1 to W3 is about 0.96, and a ratio of W2 to W3 is about 1.04. As is apparent from the resonance characteristics shown in FIG. 15, in the sixth preferred embodiment, a high impedance ratio of about 54.8 dB was exhibited. In contrast, in the fourth comparative example, a low impedance ratio of about 46.8 dB was exhibited.

Figure 16:
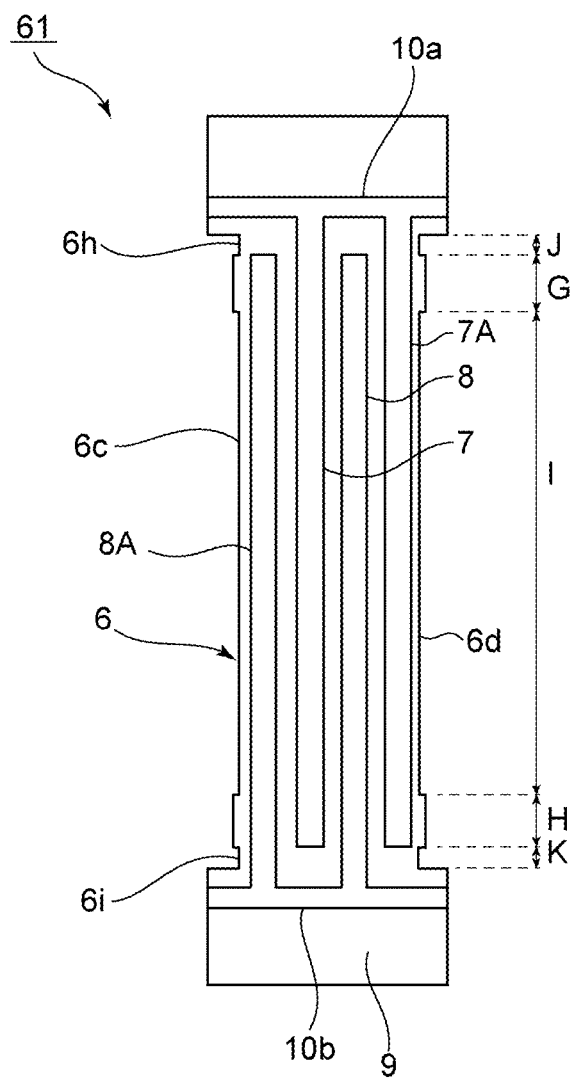
FIG. 16 is a plan view illustrating a main section of an acoustic wave device of a seventh preferred embodiment of the present invention.

FIG. 16 is a plan view illustrating a main section of an acoustic wave device according to a seventh preferred embodiment.

In an acoustic wave device 6l of the seventh preferred embodiment, two first electrode fingers 7, 7A and two second electrode fingers 8, 8A are interdigitated with each other. In this manner, a plurality of first electrode fingers and a plurality of second electrode fingers may both be provided.

A width of each portion of a piezoelectric body 6 in the acoustic wave device 6l is shown in Table 5 below. A width of each portion of a piezoelectric body in the fifth comparative example is also shown in Table 5. The acoustic wave device of the fifth comparative example is the same or substantially the same as the acoustic wave device 61 of the seventh preferred embodiment except that the width of the piezoelectric body is uniform.

In the acoustic wave device of the seventh preferred embodiment, a ratio of W1 to W3 is about 0.98, and a ration of W2 to W3 is about 1.02.

TABLE 5

| Unit: μm | Seventh preferred embodiment | | Fifth comparative example | |
| --- | --- | --- | --- | --- |
| Region | Length | Width | Length | Width |
| Portion J | 0.5 | 4.51 | 0.5 | 4.6 |
| Thick width portion G | 1.1 | 4.69 | 1.1 | 4.6 |
| Center portion I | 12.6 | 4.6 | 12.6 | 4.6 |
| Thick width portion H | 1.1 | 4.69 | 1.1 | 4.6 |
| Portion K | 0.5 | 4.51 | 0.5 | 4.6 |

Figure 17:
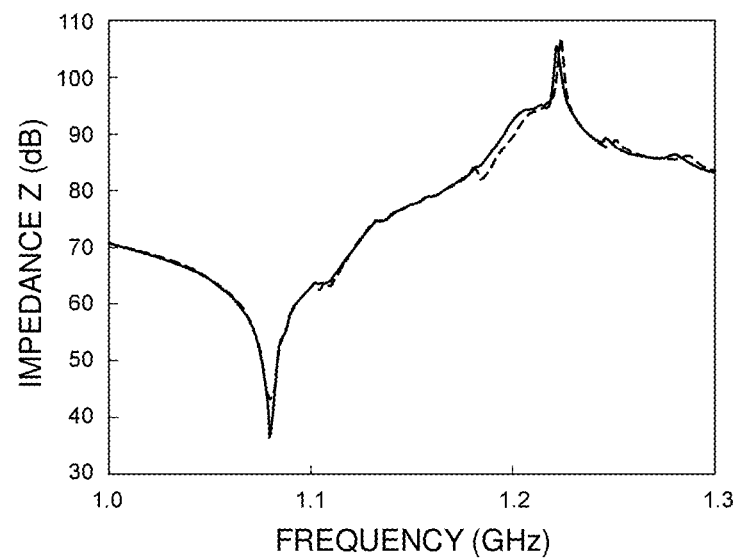
FIG. 17 is a graph showing resonance characteristics of the acoustic wave device of the seventh preferred embodiment of the present invention and those of an acoustic wave device of a fifth comparative example.

FIG. 17 is a graph showing resonance characteristics of the acoustic wave device 61 of the seventh preferred embodiment and those of an acoustic wave device of a fifth comparative example. A solid line shows a result of the seventh preferred embodiment, and a broken line shows a result of the fifth comparative example. As shown in FIG. 17, in the seventh preferred embodiment, a high impedance ratio of about 61 dB was exhibited. In contrast, in the fifth comparative example, a low impedance ratio of about 52 dB was exhibited.

Figure 18:
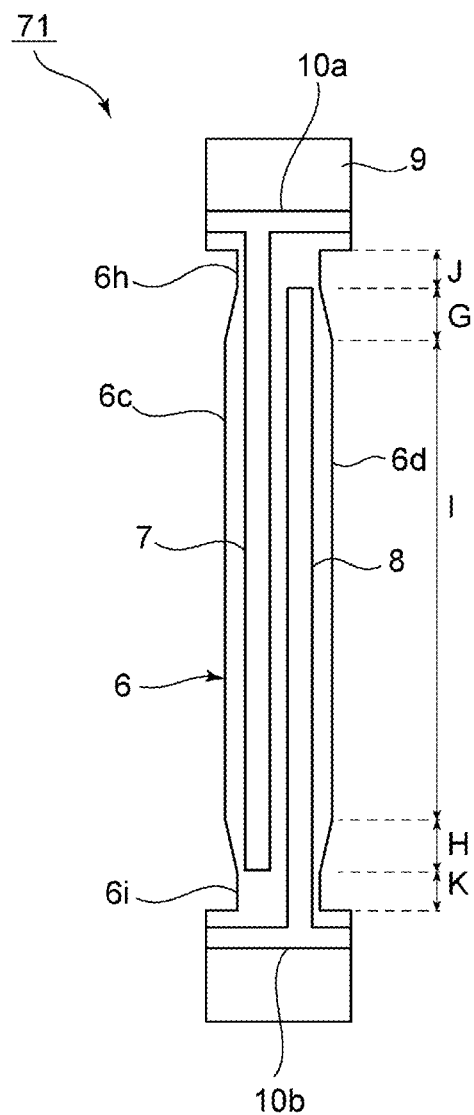
FIG. 18 is a plan view illustrating a main section of an acoustic wave device according to an eighth preferred embodiment of the present invention.
Figure 19:
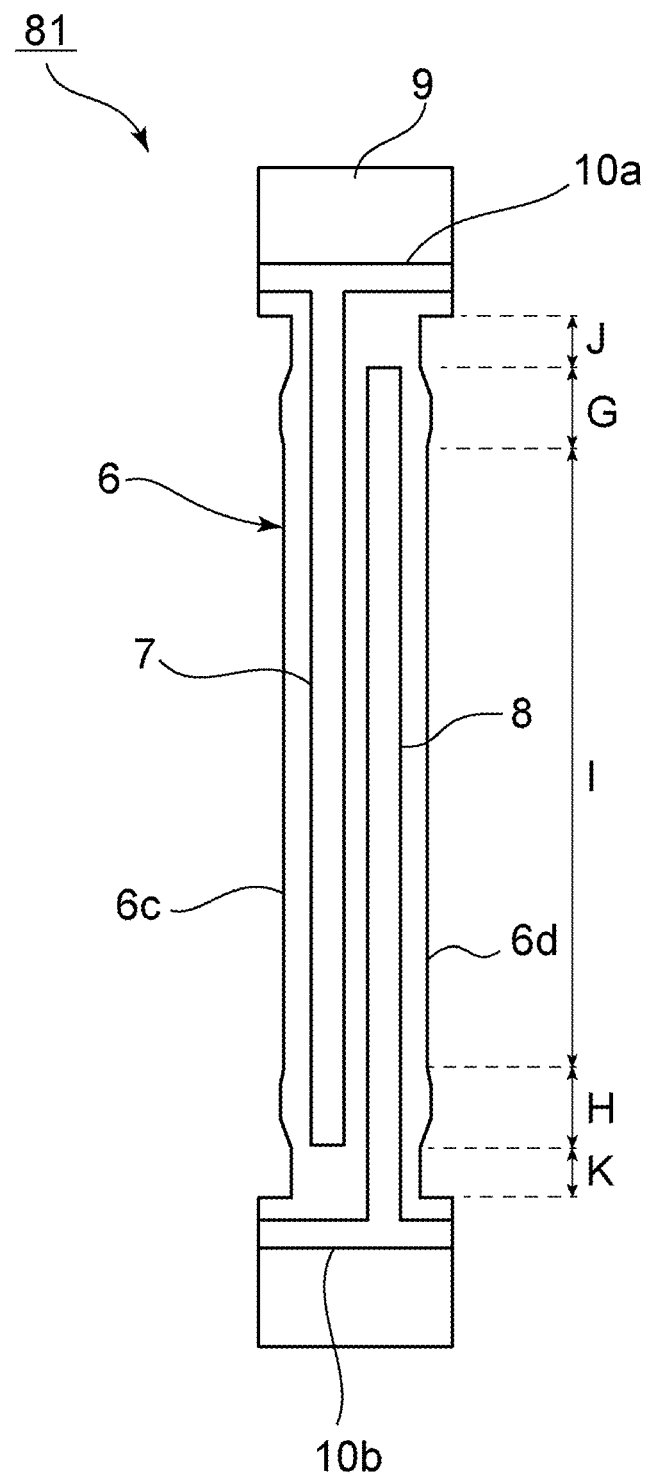
FIG. 19 is a plan view illustrating a main section of an acoustic wave device according to a ninth preferred embodiment of the present invention.
Figure 20:
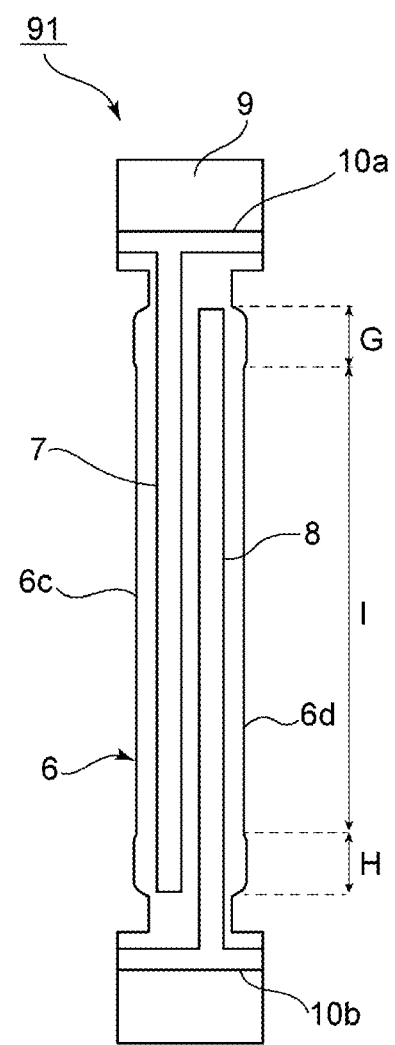
FIG. 20 is a plan view illustrating a main section of an acoustic wave device according to a tenth preferred embodiment of the present invention.

FIGS. 18 to 20 are plan views illustrating main sections of acoustic wave devices of eighth to tenth preferred embodiments of the present invention, respectively. Also in FIGS. 18 to 20, only the main section of each acoustic wave device provided with a piezoelectric body is illustrated in a plan view in the same manner as in FIG. 14 or the like.

In an acoustic wave device 71 of the eighth preferred embodiment, the width of a piezoelectric body 6 at a center portion I is constant. Portions extending in the second direction from outer-side ends of the center portion I to anchor portions 6h and 6i are denoted by the symbols G and H respectively in the same or similar manner as in the third preferred embodiment, so as to be represented as a portion G and a portion H. In the portions G and H, the width of the piezoelectric body 6 becomes gradually smaller toward outer side portions in the second direction. As described above, in the piezoelectric body 6, the width does not need to be constant in a different width portion having a width different from the width of the piezoelectric body 6 at the central portion of the intersecting portion in the second direction, and may be changed in the second direction.

In an acoustic wave device 81 of the ninth preferred embodiment illustrated in FIG. 19, in each of a thick width portion G and a thick width portion H, both sides thereof in the second direction are tapered to be gradually thinned. Other configurations of the acoustic wave device 81 are preferably the same or substantially the same as those of the acoustic wave device 21. As described above, in the thick width portion G and the thick width portion H, the thick width portion G and the thick width portion H may be thinned toward outer side portions in the second direction.

In an acoustic wave device 91 of the tenth preferred embodiment illustrated in FIG. 20, in a thick width portion G and a thick width portion H, corners of the portions where widths of a piezoelectric body 6 differ are rounded in a plan view. In this manner, the corner portions on both sides of the thick width portions G and H in the second direction may be rounded.

Figure 21:
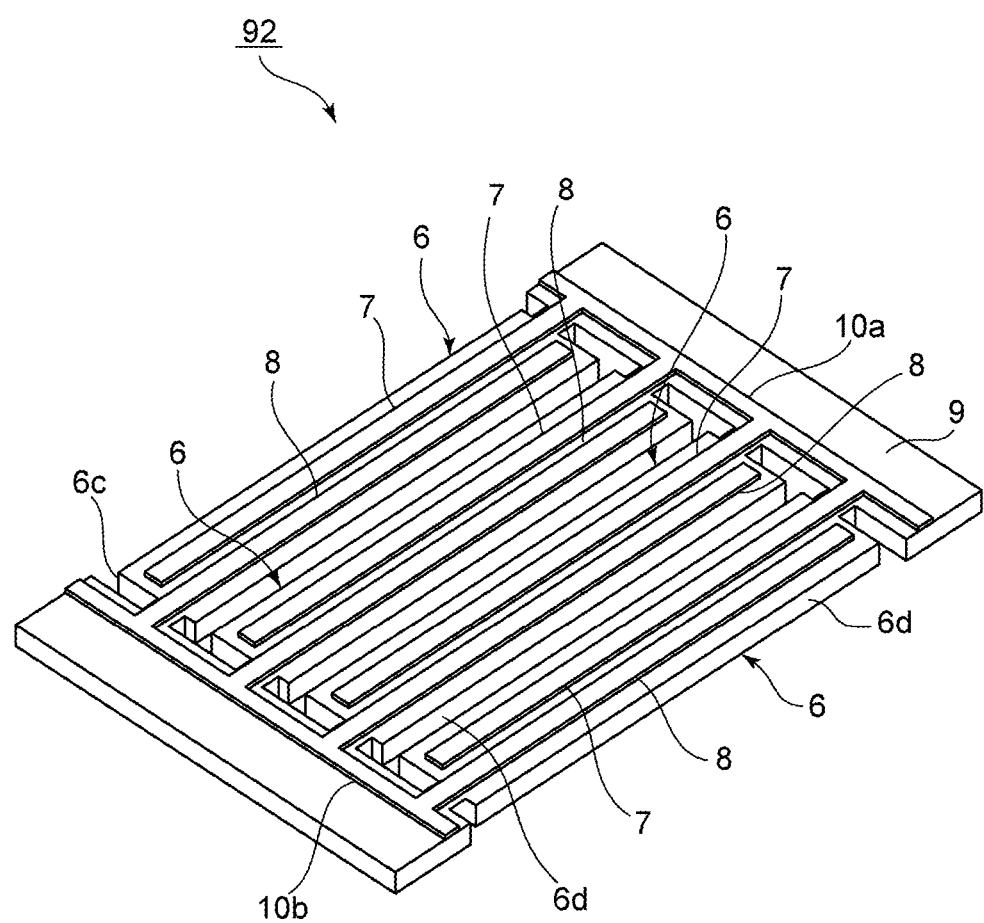
FIG. 21 is a perspective view illustrating a main section of an acoustic wave device according to an eleventh preferred embodiment of the present invention.

FIG. 21 is a perspective view that explain a main section of an acoustic wave device according to an eleventh preferred embodiment of the present invention.

In an acoustic wave device 92, four of the acoustic wave devices of the first preferred embodiment are preferably connected in parallel to each other. In this manner, a plurality of acoustic wave devices may have a structure in which a plurality of acoustic wave devices are connected to each other. With this, when impedances of the respective acoustic wave devices are taken as $Z_1$, $Z_2$, $Z_3$, and $Z_4$, a combined impedance $Z_T$ is expressed by an equation of $1/Z_T = 1/Z_1 + 1/Z_2 + 1/Z_3 + 1/Z_4$. In this manner, the acoustic wave devices of N pieces (N is an integer) may be connected in parallel and integrated. By doing so, a combined impedance is able to be adjusted.

Figure 22A:
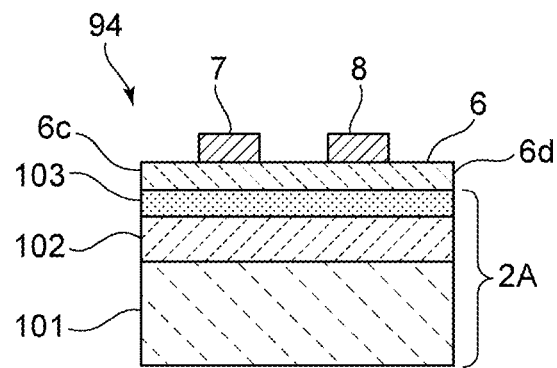
FIGS. 22A and 22B are cross-sectional views of acoustic wave devices according to twelfth and thirteenth preferred embodiments of the present invention, respectively.
Figure 22B:
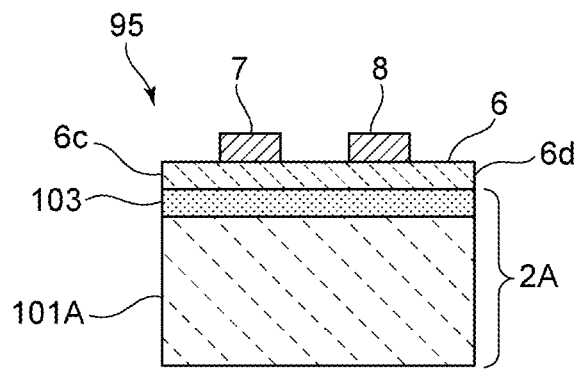

FIGS. 22A and 22B are cross-sectional views of acoustic wave devices 94 and 95 according to twelfth and thirteenth preferred embodiments of the present invention, respectively. In the acoustic wave device 94, a piezoelectric body 6 is laminated on a support member 2A. The support member 2A preferably includes a support substrate 101, a high acoustic velocity material layer 102 provided on the support substrate 101, and a low acoustic velocity material layer 103 provided on the high acoustic velocity material layer 102. The support substrate 101 is preferably made of an appropriate insulating material such as Si or alumina, for example. The high acoustic velocity material layer 102 is made of a high acoustic velocity material in which the acoustic velocity of a propagating bulk wave is faster than the acoustic velocity of an acoustic wave propagating in the piezoelectric body 6. The low acoustic velocity material layer 103 is made of a low acoustic velocity material in which the acoustic velocity of a propagating bulk wave is slower than the acoustic velocity of the acoustic wave propagating in the piezoelectric body 6. The material of the low acoustic velocity material is not particularly limited as long as it satisfies the acoustic velocity relationship described above. The material of the high acoustic velocity material layer 102 is not particularly limited as long as it satisfies the acoustic velocity relationship described above. In the present preferred embodiment, for example, the low acoustic velocity material layer 103 is preferably made of silicon oxide, and the high acoustic velocity material layer 102 is preferably made of Si.

In the acoustic wave device 95, a support member 2A has a structure in which a low acoustic velocity material layer 103 is provided on a high acoustic velocity substrate 101A. Other structures of the acoustic wave device 95 are preferably the same as or similar to those of the acoustic wave device 94.

The high acoustic velocity substrate 101A is made of the high acoustic velocity material described above. In this manner, instead of the structure in which the support substrate 101 and the high acoustic velocity material layer 102 are laminated, the high acoustic velocity substrate 101A may be used. Further, only the high acoustic velocity substrate 101A may be provided under a piezoelectric body 6, and the low acoustic velocity material layer 103 may be omitted.

Figure 23:
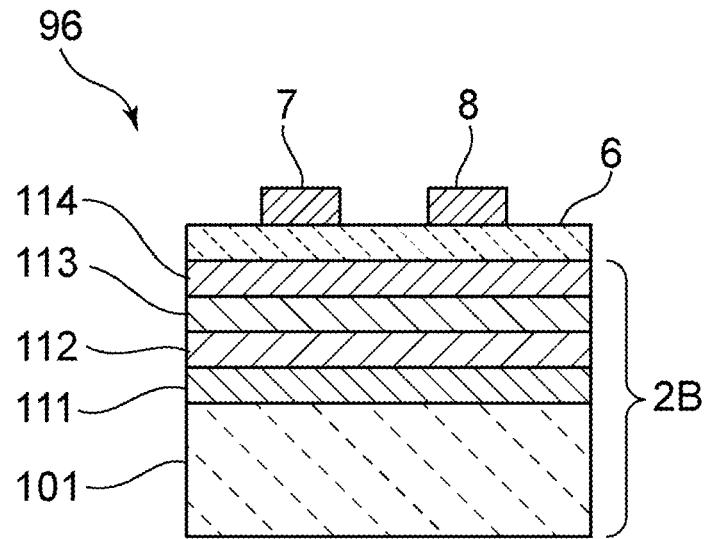
FIG. 23 is a cross-sectional view of an acoustic wave device according to a fourteenth preferred embodiment of the present invention.

In an acoustic wave device 96 according to a fourteenth preferred embodiment of the present invention illustrated in FIG. 23, a piezoelectric body 6 is laminated on a support surface which is an upper surface of a support member 2B. The support member 2B includes a support substrate 101 and a high acoustic impedance layer 111, a low acoustic impedance layer 112, a high acoustic impedance layer 113, and a low acoustic impedance layer 114 laminated on the support substrate 101. The acoustic impedance of the high acoustic impedance layers 111 and 113 is higher than the acoustic impedance of the low acoustic impedance layers 112 and 114. As described above, the support member 2B including the high acoustic impedance layers 111, 113 and the low acoustic impedance layers 112, 114 may be used. In this case as well, the piezoelectric body 6 may be directly laminated on the upper surface of the supporting member 2B defining and functioning as the support surface. Also in the acoustic wave devices 94 to 96, a dielectric layer, such as a silicon oxide film, for example, may be laminated under the piezoelectric body 6 to improve frequency-temperature characteristics.

In preferred embodiments of the present invention, the acoustic wave to be used is not limited to a plate wave, and other acoustic waves, such as leaky waves and Love waves, for example, may be used.

The acoustic wave device of each of the above preferred embodiments may be used as a component of a duplexer or the like of a high frequency front end circuit. An example of a communication apparatus including such a high frequency front end circuit will be described below.

Figure 24:
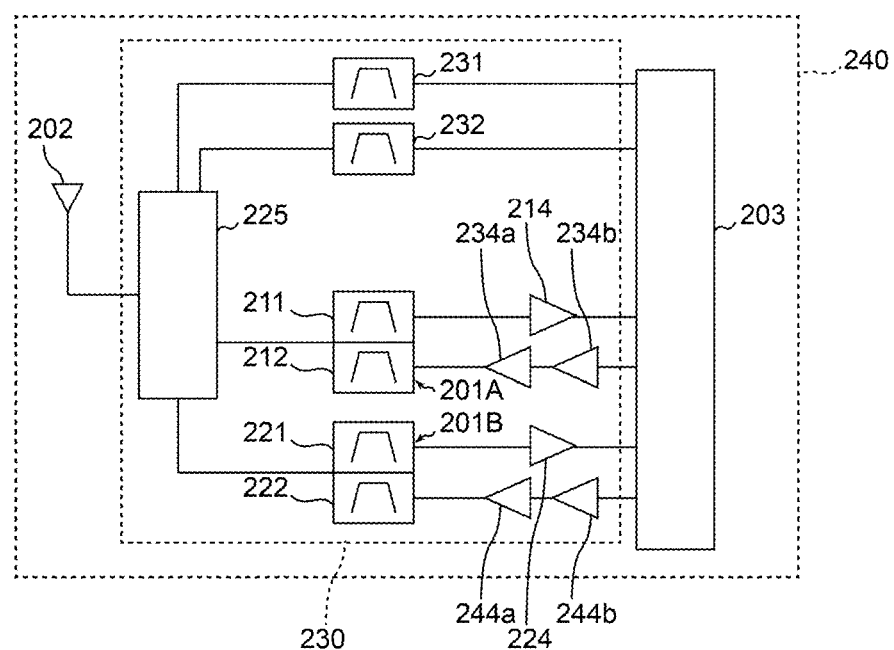
FIG. 24 is a configuration diagram of a communication apparatus including a high frequency front end circuit according to a preferred embodiment of the present invention.

FIG. 24 is a configuration diagram of a communication apparatus including a high frequency front end circuit. Elements connected to a high frequency front end circuit 230, for example, an antenna element 202 and a radio frequency (RF) signal processing circuit (RFIC) 203 are also illustrated in the drawing. The high frequency front end circuit 230 and the RF signal processing circuit 203 define a communication apparatus 240. The communication apparatus 240 may include a power supply, a CPU or a display, for example.

The high frequency front end circuit 230 preferably includes a switch 225, duplexers 201A and 201B, low-noise amplifier circuits 214 and 224, filters 231 and 232, and power amplifier circuits 234a, 234b, 244a, and 244b. Note that the high frequency front end circuit 230 and the communication apparatus 240 illustrated in FIG. 24 are merely examples of a high frequency front end circuit and a communication apparatus, and are not limited to this configuration.

The duplexer 201A includes filters 211 and 212. The duplexer 201B includes filters 221 and 222. The duplexers 201A and 201B are connected to the antenna device 202 via the switch 225. Acoustic wave devices according to preferred embodiments of the present invention may be the duplexers 201A and 201B, or may be the filters 211, 212, 221, and 222. The acoustic wave devices according to preferred embodiments of the present invention may be acoustic wave resonators defining the duplexers 201A and 201B, and the filters 211, 212, 221, and 222. Further, the acoustic wave devices according to preferred embodiments of the present invention may also be applied to a configuration including three or more filters, such as a triplexer in which three filters share the antenna terminal and a hexaplexer in which six filters share the antenna terminal.

In other words, the above-discussed acoustic wave devices according to preferred embodiments of the present invention include an acoustic wave resonator, a filter, and a multiplexer provided with two or more filters, for example.

The switch 225 connects the antenna device 202 to a signal path corresponding to a predetermined band in accordance with a control signal from a controller (not illustrated), and is preferably defined by, for example, a single pole double throw (SPDT) type switch. Note that the number of signal paths connected to the antenna device 202 is not limited to one, and a plurality of signal paths may be connected thereto. That is, the high frequency front end circuit 230 may support the carrier aggregation.

The low-noise amplifier circuit 214 is preferably a reception amplifier circuit configured to amplify a high frequency signal (a high frequency reception signal in this case) coming through the antenna device 202, the switch 225, and the duplexer 201A, and output the amplified high frequency signal to the RF signal processing circuit 203. The low-noise amplifier circuit 224 is preferably a reception amplifier circuit configured to amplify a high frequency signal (a high frequency reception signal in this case) coming through the antenna device 202, the switch 225, and the duplexer 201B, and output the amplified high frequency signal to the RF signal processing circuit 203.

The power amplifier circuits 234a and 234b are preferably transmission amplifier circuits configured to amplify a high frequency signal (a high frequency transmission signal in this case) outputted from the RF signal processing circuit 203, and output the amplified high frequency signal to the antenna device 202 via the duplexer 201A and the switch 225. The power amplifier circuits 244a and 244b are preferably transmission amplifier circuits configured to amplify a high frequency signal (a high frequency transmission signals in this case) outputted from the RF signal processing circuit 203, and output the amplified high frequency signal to the antenna device 202 via the duplexer 201B and the switch 225.

The filters 231 and 232 are connected between the RF signal processing circuit 203 and the switch 225 without passing through any of the low-noise amplifier circuit and the power amplifier circuit. The filters 231 and 232 are also connected to the antenna device 202 via the switch 225, similarly to the duplexers 201A and 201B.

The RF signal processing circuit 203 performs signal processing, by down-conversion or the like, on a high frequency reception signal inputted from the antenna device 202 through a reception signal path, and outputs a reception signal generated by performing the signal processing. In addition, the RF signal processing circuit 203 performs signal processing, by up-conversion or the like, on an inputted transmission signal, and outputs a high frequency transmission signal generated by performing the signal processing to the power amplifier circuits 244a and 244b. The RF signal processing circuit 203 is, for example, an RFIC. The communication apparatus may include a baseband (BB) IC. In this case, the BBIC performs signal processing on the received signal having experienced the processing by the RFIC. The BBIC performs signal processing on a transmission signal to output it to the RFIC. The reception signal processed by the BBIC and the transmission signal before the signal processing by the BBIC are, for example, an image signal, a sound signal, and the like. Note that the high frequency front end circuit 230 may include other circuit elements between the above-discussed constituent elements.

The high frequency front end circuit 230 may include duplexers according to a modification of the duplexers 201A and 201B in place of the duplexers 201A and 201B.

Thus far, the acoustic wave devices, the high frequency front end circuits, and the communication apparatuses according to the preferred embodiments of the present invention have been described. However, other preferred embodiments obtained by combining any components in the above-described preferred embodiments, modifications obtained by making variations conceived by those skilled in the art on the above-described preferred embodiments without departing from the spirit and scope of the present invention, and various kinds of apparatuses incorporating the high frequency front end circuit and the communication apparatus according to the present invention are also included in the present invention.

The present invention may be widely applicable to acoustic wave resonators, filters, a multiplexer provided with two or more filters, high frequency front end circuits, and communication apparatuses such as mobile phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An end surface reflection acoustic wave device in which acoustic waves are reflected between a first end surface and a second end surface opposing each other, the acoustic wave device comprising:
    a piezoelectric body including the first end surface and the second end surface, and a first principal surface and a second principal surface opposing each other and connecting the first end surface and the second end surface;
    a first electrode finger provided on the first principal surface of the piezoelectric body and extending in a second direction, where a direction in which the first end surface and the second end surface are connected is defined as a first direction and a direction orthogonal or substantially orthogonal to the first direction on the first principal surface is defined as the second direction; and
    a second electrode finger provided on the first principal surface of the piezoelectric body, arranged separately from the first electrode finger with a gap interposed between the first electrode finger and the second electrode finger, and extending in the second direction on the first principal surface of the piezoelectric body; wherein
    a portion in which the first electrode finger and the second electrode finger overlap with each other when viewed from the first direction is defined as an intersecting portion, a distance between the first end surface and the second end surface of the piezoelectric body is defined as a width of the piezoelectric body, and the piezoelectric body is provided with a different width portion having a width different from a width of the piezoelectric body at a central portion of the intersecting portion in the second direction in a region where the first end surface and the second end surface oppose each other.

2. The acoustic wave device according to claim 1, wherein the different width portion includes a thin width portion; and
    the thin width portion has a smaller width than the width of the piezoelectric body at the central portion.

3. The acoustic wave device according to claim 2, wherein the thin width portion is provided in at least one of a first outer side portion and a second outer side portion of the intersecting portion in the second direction.

4. The acoustic wave device according to claim 2, further comprising:
recessed portions opposing each other in the first direction at both of the first end surface and the second end surface of the piezoelectric body and including the thin width portion.

5. The acoustic wave device according to claim 1, wherein the different width portion includes a thick width portion; and
the thick width portion is larger in width than the width of the piezoelectric body at the central portion.

6. The acoustic wave device according to claim 5, wherein within the intersecting portion, the thick width portion is provided at each of a first end side and a second end side of the intersecting portion in the second direction.

7. The acoustic wave device according to claim 1, wherein
in the second direction, the first electrode finger is extended to a first outer side portion of the intersecting portion, and the second electrode finger is extended to a second outer side portion of the intersecting portion; and
a first busbar and a second busbar are respectively connected to the first electrode finger and the second electrode finger and extend in a direction intersecting with the second direction.

8. The acoustic wave device according to claim 7, wherein
the different width portion includes a first thin width portion and a second thin width portion;
the first thin width portion has a width smaller than the width of the piezoelectric body at the central portion, and is disposed in the first outer side portion of the intersecting portion and at an inner side of the first busbar in the second direction; and
the second thin width portion has a width smaller than the width of the piezoelectric body at the central portion, and is disposed in the second outer side portion of the intersecting portion and at an inner side of the second busbar in the second direction.

9. The acoustic wave device according to claim 1, wherein the different width portion tapers in the second direction toward an outer side or an inner side.

10. The acoustic wave device according to claim 1, wherein a plurality of at least one of the first electrode finger and the second electrode finger are provided.

11. The acoustic wave device according to claim 1, wherein
the piezoelectric body is a piezoelectric film;
the acoustic wave device further comprises a support member including a support surface supporting the piezoelectric film and including a recessed portion on the support surface; and
the piezoelectric film is fixed to the support member such that at least the intersecting portion of the piezoelectric film is located on or above the recessed portion with respect to the support member.

12. The acoustic wave device according to claim 1, further comprising:
a support member that supports the piezoelectric body; wherein
the support member includes a high acoustic velocity material layer in which a bulk wave propagates at a higher acoustic velocity than an acoustic velocity of an acoustic wave propagating in the piezoelectric body.

13. The acoustic wave device according to claim 12, wherein the support member includes a low acoustic velocity material layer which is provided closer to a side of the piezoelectric body than the high acoustic velocity material layer, and in which a bulk wave propagates at a lower acoustic velocity than the acoustic velocity of an acoustic wave propagating in the piezoelectric body.

14. The acoustic wave device according to claim 12, wherein the support member is a high acoustic velocity substrate made of the high acoustic velocity material layer.

15. The acoustic wave device according to claim 12, wherein
the piezoelectric body includes a vibration body portion having a rectangular or substantially rectangular shape, a first anchor portion connected to one end of the vibration body portion, and a second anchor portion connected to another end of the vibration body; and
both of the first anchor portion and the second anchor portion are connected to different portions of the support member.

16. The acoustic wave device according to claim 1, further comprising:
a support member that supports the piezoelectric body; wherein
the support member includes a low acoustic impedance layer having a relatively low acoustic impedance; and
a high acoustic impedance layer having a relatively high acoustic impedance.

17. A manufacturing method of the acoustic wave device according to claim 1, the method comprising:
processing the piezoelectric body to provide the different width portion in which a width of the piezoelectric body is partially different; and
providing the first and second electrode fingers on the first principal surface of the piezoelectric body.

18. The acoustic wave device according to claim 1, wherein a plurality of the first electrode fingers and a plurality of the second electrode fingers are provided.

19. A high frequency front end circuit comprising:
the acoustic wave device according to claim 1; and
a power amplifier.

20. A communication apparatus comprising:
the high frequency front end circuit according to claim 19; and
a radio frequency signal processing circuit.

* * * * *